United States Patent
Teva et al.

(10) Patent No.: US 10,374,114 B2
(45) Date of Patent: Aug. 6, 2019

(54) LATERAL SINGLE-PHOTON AVALANCHE DIODE AND METHOD OF PRODUCING A LATERAL SINGLE-PHOTON AVALANCHE DIODE

(71) Applicant: ams AG, Unterpremstaetten (AT)

(72) Inventors: Jordi Teva, Veldhoven (NL); Frederic Roger, Graz (AT); Ewald Stueckler, Unterpremstaetten (AT); Stefan Jessenig, Graz (AT); Rainer Minixhofer, Unterpremstaetten (AT); Ewald Wachmann, Kainbach (AT); Martin Schrems, Eggersdorf (AT); Guenther Koppitsch, Lieboch (AT)

(73) Assignee: ams AG, Unterpremstaetten (AT)

( * ) Notice: Subject to any disclaimer, the term of this patent is extended or adjusted under 35 U.S.C. 154(b) by 177 days.

(21) Appl. No.: 14/777,484

(22) PCT Filed: Mar. 11, 2014

(86) PCT No.: PCT/EP2014/054684
§ 371 (c)(1),
(2) Date: Sep. 15, 2015

(87) PCT Pub. No.: WO2014/140000
PCT Pub. Date: Sep. 18, 2014

(65) Prior Publication Data
US 2016/0035929 A1  Feb. 4, 2016

(30) Foreign Application Priority Data
Mar. 15, 2013 (EP) .................................. 13159520

(51) Int. Cl.
*H01L 31/107* (2006.01)
*H01L 31/0224* (2006.01)
(Continued)

(52) U.S. Cl.
CPC .... *H01L 31/107* (2013.01); *H01L 31/022408* (2013.01); *H01L 31/03529* (2013.01);
(Continued)

(58) Field of Classification Search
CPC ...................................................... H01L 31/107
See application file for complete search history.

(56) References Cited

U.S. PATENT DOCUMENTS 6,707,075 B1   3/2004 Rogers et al.
7,135,349 B2 * 11/2006 Maeng ................ H01L 27/1443
                                                       438/48
(Continued)

FOREIGN PATENT DOCUMENTS

EP   1146557 A2   10/2001
EP   2355155 A2   8/2011
(Continued)

OTHER PUBLICATIONS

Chung et al., "Lateral SI Avalanche Photodiode Fabricated Over an Etched Interdigital Mesa", Nov. 8, 1990, Electronics Letters, vol. 26, No. 23, pp. 1946-1947.*
(Continued)

*Primary Examiner* — Jose R Diaz
(74) *Attorney, Agent, or Firm* — Fish & Richardson P.C.

(57) ABSTRACT

The lateral single-photon avalanche diode comprises a semiconductor body comprising a semiconductor material of a first type of electric conductivity, a trench in the semiconductor body, and anode and cathode terminals. A junction region of the first type of electric conductivity is located near the sidewall of the trench, and the electric conductivity is higher in the junction region than at a farther distance from the sidewall. A semiconductor layer of an opposite second type of electric conductivity is arranged at the sidewall of the trench adjacent to the junction region. The anode and
(Continued)

cathode terminals are electrically connected with the semiconductor layer and with the junction region, respectively. The junction region may be formed by a sidewall implantation.

8 Claims, 8 Drawing Sheets

(51) Int. Cl.
  *H01L 31/0352* (2006.01)
  *H01L 31/0368* (2006.01)
  *H01L 31/18* (2006.01)
(52) U.S. Cl.
  CPC ...... *H01L 31/03682* (2013.01); *H01L 31/182* (2013.01); *Y02E 10/50* (2013.01)

(56) References Cited

U.S. PATENT DOCUMENTS

| | | | |
|---|---|---|---|
| 7,462,889 | B2 | 12/2008 | Yagyu et al. |
| 7,659,564 | B2 * | 2/2010 | Adkisson ............ H01L 27/1463 257/293 |
| 9,293,626 | B2 * | 3/2016 | Jonak-Auer ...... H01L 27/14609 |
| 2007/0145411 | A1 | 6/2007 | Chen et al. |
| 2008/0191240 | A1 | 8/2008 | Yagyu et al. |
| 2010/0084695 | A1 | 4/2010 | Park |
| 2010/0148040 | A1 | 6/2010 | Sanfilippo et al. |
| 2011/0018085 | A1 * | 1/2011 | An ........................ H01L 31/107 257/437 |
| 2012/0025340 | A1 | 2/2012 | Park |

FOREIGN PATENT DOCUMENTS

| | | |
|---|---|---|
| EP | 2592661 A1 | 5/2013 |
| EP | 2713409 A1 | 4/2014 |
| FR | 2475296 A1 | 8/1981 |

OTHER PUBLICATIONS

Chung, M.-H. et al.: "Lateral Si Avalanche Photodiode Fabricated Over an Etched Interdigital Mesa", Electronics Letters, vol. 26, No. 23, Nov. 8, 1990, pp. 1946-1947.

Mita, Y. et al.: "Deep-Trench Vertical Si Photodiodes for Improved Efficiency and Crosstalk", IEEE Journal of Selected Topics in Quantum Electronics, vol. 13, No. 2, Mar. 2007, pp. 386-391.

* cited by examiner

LATERAL SINGLE-PHOTON AVALANCHE DIODE AND METHOD OF PRODUCING A LATERAL SINGLE-PHOTON AVALANCHE DIODE

BACKGROUND OF THE INVENTION

Single-photon avalanche diodes (SPAD), also called Geiger-mode avalanche photodiodes, are suitable to detect extremely weak radiation. Avalanche photodiodes having the pn junction biased in the reverse direction become conducting when the applied voltage exceeds a breakdown voltage. A single-photon avalanche diode is operated with reverse bias voltage above the breakdown voltage, in the so-called Geiger-mode. In this mode of operation the electric field strength in the space charge region can attain values of more than 500 kV/cm, so that already few electron-hole pairs generated by incident photons and injected into the depletion layer can trigger a self-sustaining avalanche current of several mA.

US 2012/0025340 A1 discloses a vertical silicon photomultiplier for Geiger-mode operation. A pattern of trench electrodes provides anodes and cathodes of a pixel array. A pn-junction layer is arranged at the walls of the cathodes.

US 2010/0148040 A1 discloses a single-photon avalanche diode comprising an n-type semiconductor body providing an active region including the cathode, a trench extending through the body around the active region and providing a laterally isolating region, a depletion region, and a p-type anode region at a surface of the active region.

U.S. Pat. No. 7,462,889 B2 discloses an avalanche photodiode with a ring shape trench region surrounding a light receiving region.

US 2008/0191240 A1 discloses an avalanche photodiode with an outer trench provided in the periphery of a light absorption layer surrounding the depletion region to interrupt the path of the dark current.

US 2007/0145411 A1 discloses a trench polysilicon diode.

SUMMARY OF THE INVENTION

The lateral single-photon avalanche diode comprises a semiconductor body comprising a semiconductor material of a first type of electric conductivity, a trench having a sidewall arranged in the semiconductor body, and anode and cathode terminals. The semiconductor material comprises a junction region of the first type of electric conductivity near the sidewall of the trench, the electric conductivity being higher in the junction region than at a farther distance from the sidewall. A semiconductor layer of an opposite second type of electric conductivity is arranged at the sidewall of the trench adjacent to the junction region. The anode and cathode terminals are electrically connected with the semiconductor layer and with the junction region, respectively. The anode and cathode terminals are arranged at a surface of the semiconductor body, and a counterdoped region of the first type of electric conductivity is arranged between the semiconductor layer of the second type of electric conductivity and the surface.

In an embodiment of the lateral single-photon avalanche diode the semiconductor layer is a doped polysilicon layer arranged at the sidewall of the trench.

In a further embodiment the semiconductor layer is a doped region of the semiconductor body adjacent to the sidewall of the trench.

In a further embodiment the junction region is at a distance from the surface.

In a further embodiment a contact well of the first type of electric conductivity is arranged in the semiconductor body and provides one of the anode and cathode terminals.

In a further embodiment a further trench is arranged at a distance from the trench, and the further trench comprises one of the anode and cathode terminals.

In a further embodiment the trench is deeper than the further trench.

In a further embodiment the anode and cathode terminals are formed by electrically conductive fillings arranged in the trench and in the further trench.

The method comprises the steps of forming a trench in a semiconductor body having a first type of conductivity, the trench having a sidewall, increasing the electric conductivity near the sidewall of the trench, thus forming a junction region of the first type of conductivity, arranging a semiconductor layer of an opposite second type of electric conductivity at the sidewall of the trench adjacent to the junction region, and providing anode and cathode terminals, which are electrically connected with the semiconductor layer and with the junction region, respectively. The anode and cathode terminals are arranged at a surface of the semiconductor body, and a counterdoped region is formed between the semiconductor layer of the second type of electric conductivity and the surface by an implantation for the first type of conductivity.

In a further aspect the method comprises the steps of forming a trench in a semiconductor body having a first type of conductivity, the trench having a sidewall, increasing the electric conductivity near the sidewall of the trench, thus forming a junction region of the first type of conductivity, arranging a semiconductor layer of an opposite second type of electric conductivity at the sidewall of the trench adjacent to the junction region, and providing anode and cathode terminals, which are electrically connected with the semiconductor layer and with the junction region, respectively. The junction region is formed by an implantation in the sidewall of the trench. A collar layer is formed at an upper portion of the sidewall of the trench before the implantation in the sidewall is performed, and the collar layer shields the implantation in the sidewall.

In a further aspect, the method comprises the steps of forming a trench in a semiconductor body having a first type of conductivity, the trench having a sidewall, increasing the electric conductivity near the sidewall of the trench, thus forming a junction region of the first type of conductivity, arranging a semiconductor layer of an opposite second type of electric conductivity at the sidewall of the trench adjacent to the junction region, and providing anode and cathode terminals, which are electrically connected with the semiconductor layer and with the junction region, respectively. A collar layer is formed at an upper portion of the sidewall of the trench, and the semiconductor layer is formed by applying a doped polysilicon layer at the sidewall of the trench. The collar layer shields the upper portion of the sidewall against a diffusion of dopants from the polysilicon layer.

In variants of the method a further trench is formed at a distance from the trench, and the anode and cathode terminals are formed by introducing electrically conductive fillings in the trench and in the further trench.

The following is a detailed description of examples of the lateral single-photon avalanche diode and the appertaining method of producing a lateral single-photon avalanche diode.

DETAILED DESCRIPTION

Figure 1:
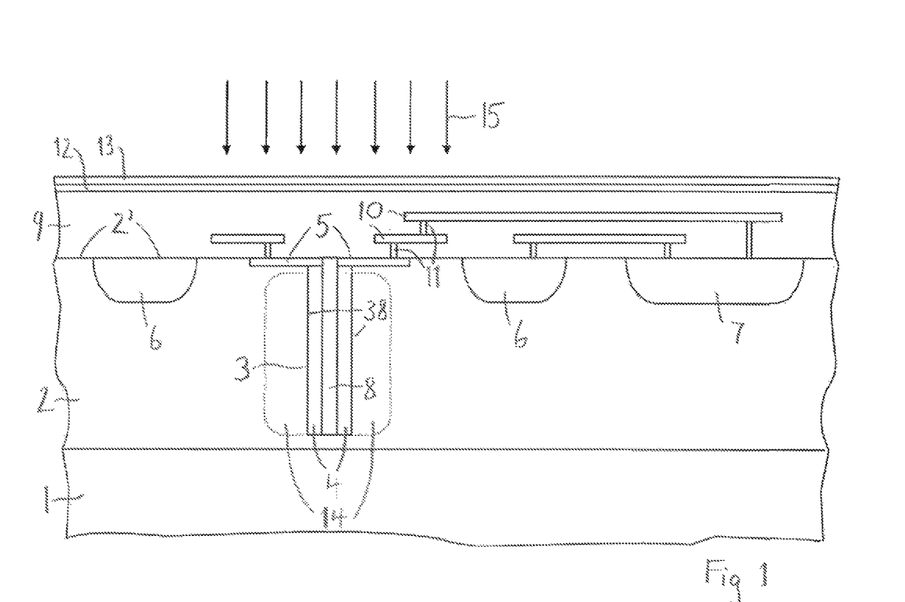
FIG. 1 is a cross section of a lateral single-photon avalanche diode.

FIG. 1 is a cross section of a lateral single-photon avalanche diode. A semiconductor body comprises a substrate 1, which may be provided with an epitaxially grown layer 2. The semiconductor body comprises a first type of electric conductivity, which may be p-type conductivity, for example. An integrated circuit 7 may be arranged at a main surface 2' of the semiconductor body and may comprise CMOS components, for example. The electric conductivity may be sufficiently low to prevent negative effects on the characteristics of the integrated circuit 7. If the integrated circuit 7 is arranged in an epi-layer 2 of low electric conductivity, the substrate 1 may have a higher electric conductivity.

A trench 3 is formed in the semiconductor body. A semiconductor layer 4 having an opposite second type of electric conductivity is arranged at the sidewall 38 of the trench 3. If the first type of electric conductivity is p-type conductivity, the second type of electric conductivity is n-type conductivity. The signs of the conductivities may instead be reversed. The semiconductor layer 4 may be doped polysilicon, for instance. Instead, the semiconductor layer 4 may be formed by a doped region of the semiconductor material of the semiconductor body, which can be formed by an implantation of a dopant for the second type of electric conductivity into the sidewall 38. If a layer of doped polysilicon is applied, the semiconductor layer 4 may include a zone of the semiconductor body that is generated by a diffusion of the dopant of the polysilicon and has the second type of electric conductivity. A remaining inner volume of the trench 3 may be filled with a suitable filling 8, which may be a dielectric material, for instance.

A region of the semiconductor body that is adjacent to the semiconductor layer 4 and has the first type of electric conductivity is adapted to form a pn-junction with the semiconductor layer 4 and will be designated as junction region 14 in the following. The electric conductivity is higher in the junction region 14 than at a farther distance from the sidewall 38. During an operation of the single-photon avalanche diode the junction region 14 is a region of high electric field strength.

A contact region 5 may be formed at the surface 2' as a terminal, which is the cathode if the second electric conductivity is n-type conductivity. The contact region 5 may be laterally confined to the semiconductor layer 4 or may instead protrude from the semiconductor layer 4, as shown in FIG. 1. In the embodiment according to FIG. 1, a contact well 6 of the first type of electric conductivity is formed at the surface 2' as a further terminal, which is the anode if the first electric conductivity is p-type conductivity. The doping of the epi-layer 2 is made sufficiently high to provide an electric connection between the contact well 6 and the junction region 14. The contact well 6 may completely surround the trench 3.

A wiring may be arranged above the surface 2' and may comprise a dielectric 9 with embedded metal layers 10 and vertical connections 11. Further layers may be applied on the upper surface of the dielectric 9, which is provided for the incidence of radiation 15 that is to be detected. The further layers may include an antireflection coating 12 and/or at least one filter layer 13, for example.

Figure 2:
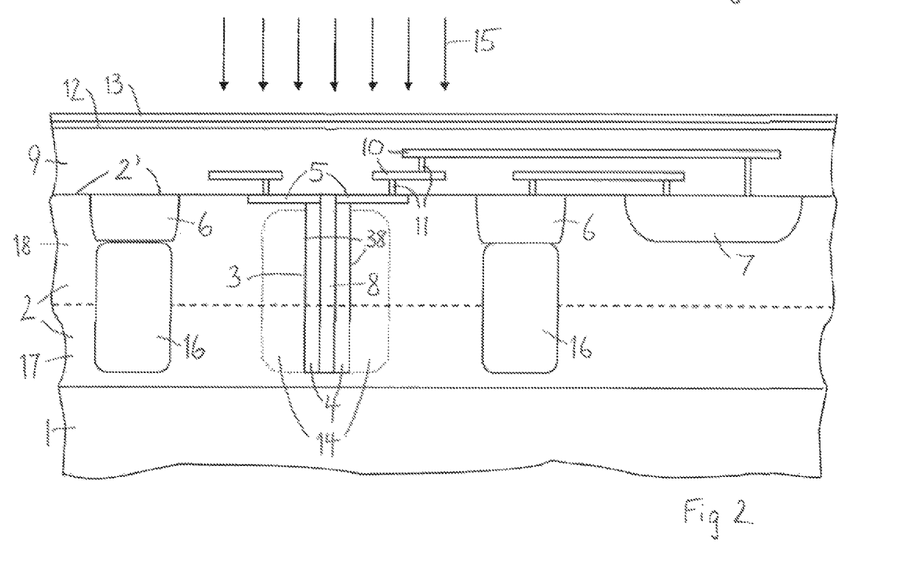
FIG. 2 is a cross section of a further lateral single-photon avalanche diode.

FIG. 2 is a cross section of a further lateral single-photon avalanche diode. The elements that correspond to elements of the avalanche diode according to FIG. 1 are designated with the same reference numerals. The avalanche diode according to FIG. 2 comprises an epi-layer 2 that is formed by two partial layers, a first epi-layer 17 and a second epi-layer 18. A buried doped region 16 of the first type of electric conductivity is arranged at the boundary between the first epi-layer 17 and the second epi-layer 18 and extends to the contact well 6, thus forming an extension of the contact well 6 deep into the epi-layer 2. The buried doped region 16 may thus reach the level of the bottom of the trench 3, so that the contact well 6 and the buried doped region 16 form a continuous terminal region, in particular the anode terminal, opposite the total lateral area of the junction region 14.

Figure 3:
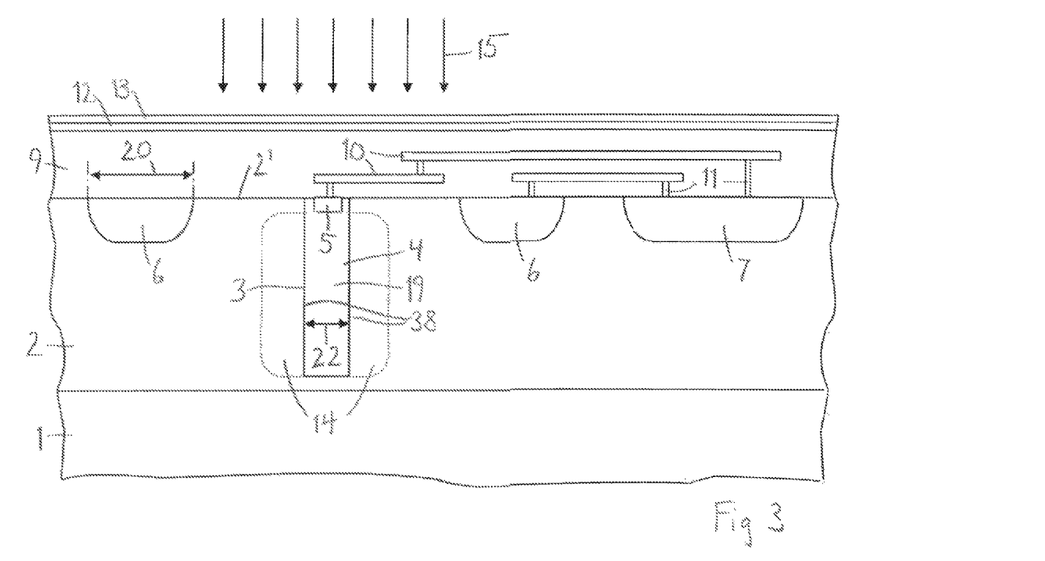
FIG. 3 is a cross section of a further lateral single-photon avalanche diode.

FIG. 3 is a cross section of a further lateral single-photon avalanche diode. The elements that correspond to elements of the avalanche diode according to FIG. 1 are designated with the same reference numerals. In the avalanche diode according to FIG. 3, the trench 3 is completely filled with doped polysilicon of the second type of electric conductivity. The polysilicon filling 19 includes the semiconductor layer 4 forming the pn-junction with the junction region 14. In this avalanche diode the contact region 5 may be laterally confined to the polysilicon filling 19, as shown in FIG. 3.

Figure 4:
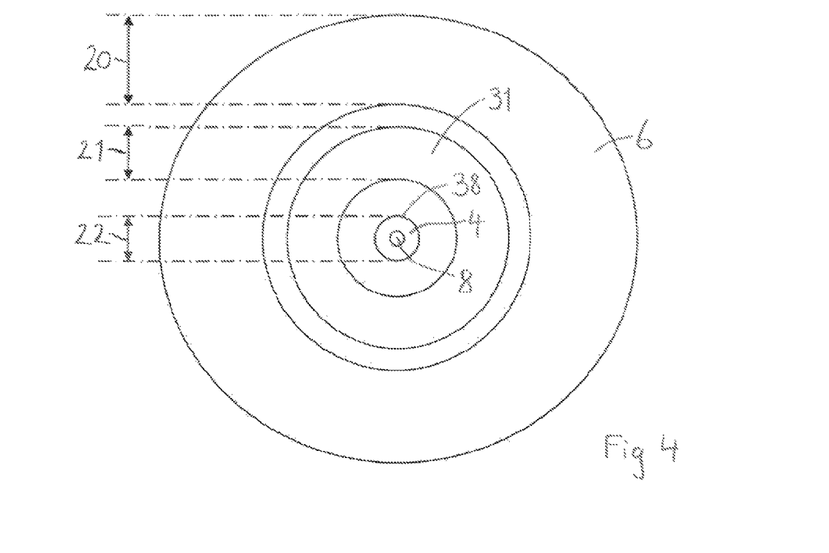
FIG. 4 is a schematic plan view.

FIG. 4 is a schematic plan view indicating possible shapes and dimensions of the semiconductor layer 4, the contact well 6, the trench filling 8 and the area of the space charge region 31 during the operation of the single-photon avalanche diode. The width 20 of the contact well 6 is also indicated in FIG. 3 and may be typically 1 µm to 2 µm, for instance. The width 21 of the space charge region 31 may be typically about 1 µm, for instance. The diameter 22 of the trench 3 is also indicated in FIG. 3 and may be typically 1 µm, for instance. In the avalanche diode according to FIG. 4, the trench 3 is cylindrical and is completely surrounded by the contact well 6, which may be arranged at a distance from the trench 3. The location of the semiconductor layer 4 and the junction region 14 may be arranged in such a manner that the space charge region 31 is at a distance from the sidewall 38 of the trench 3.

Figure 5:
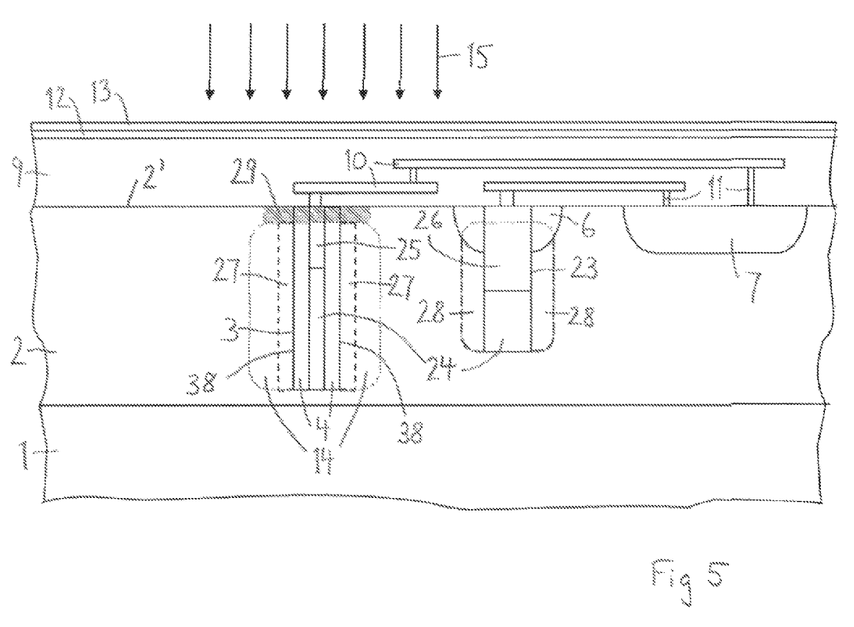
FIG. 5 is a cross section of an embodiment of the lateral single-photon avalanche diode.

FIG. 5 is a cross section of an embodiment of the lateral single-photon avalanche diode. The elements that correspond to elements of the avalanche diode according to FIG. 1 are designated with the same reference numerals. The embodiment according to FIG. 5 comprises a further trench 23 to accommodate one of the terminals, particularly the anode if the first type of electric conductivity is p-type conductivity. The trench 3 and the further trench 23 may be partially filled with a dielectric material that is arranged at the bottoms. Above the partial fillings 24, electrically conductive fillings 25, 26 are introduced in the trenches 3, 23 to form the anode and cathode terminals. The electrically conductive fillings 25, 26 may comprise tungsten and tungsten silicide, for instance.

An implanted region 27 of the first type of electric conductivity may be provided to increase the doping concentration in the junction region 14 near the trench 3 and to form a low-ohmic contact of the electrically conductive filling 25 of the trench 3 to the semiconductor material of the epi-layer 2. A further implanted region 28 of the first type of electric conductivity may be provided to be contiguous with the further trench 23 in order to form a low-ohmic contact of the electrically conductive filling 26 of the further trench 23 to the semiconductor material of the epi-layer 2. A contact well 6 may be provided additionally.

Figure 6:
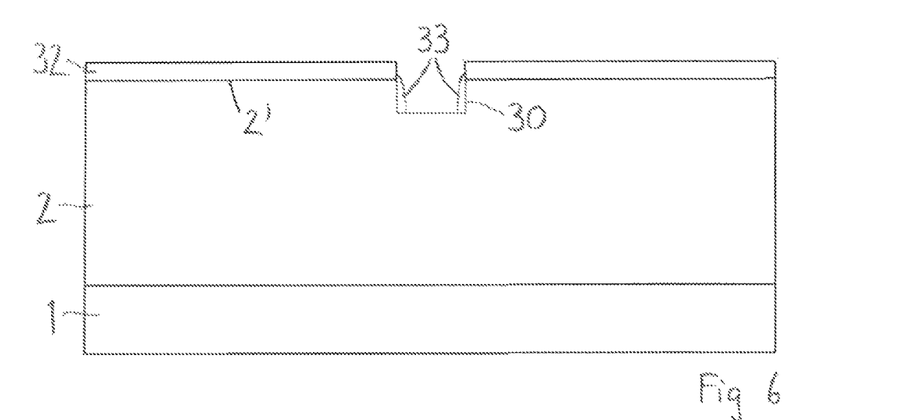
FIG. 6 is a cross section of an intermediate product of a method of producing an avalanche diode.

FIG. 6 is a cross section of a semiconductor body comprising a substrate 1 provided with an optional epi-layer 2 and a protecting cover layer 32, which may be a dielectric material like an oxide of the semiconductor material, especially $SiO_2$, for example. An opening is formed in the cover layer 32, and a partial trench 30 is etched into the semiconductor body. In the embodiment shown in FIG. 6 the partial trench 30 is formed within the epi-layer 2.

A collar layer 33, which may be SiN for example, is formed at least at the sidewall of the partial trench 30. The collar layer 33 can be formed by applying a conformal layer and etching the layer back anisotropically. The remaining portion of the layer is shown in FIG. 6 as the collar layer 33 at the sidewall of the partial trench 30.

Figure 7:
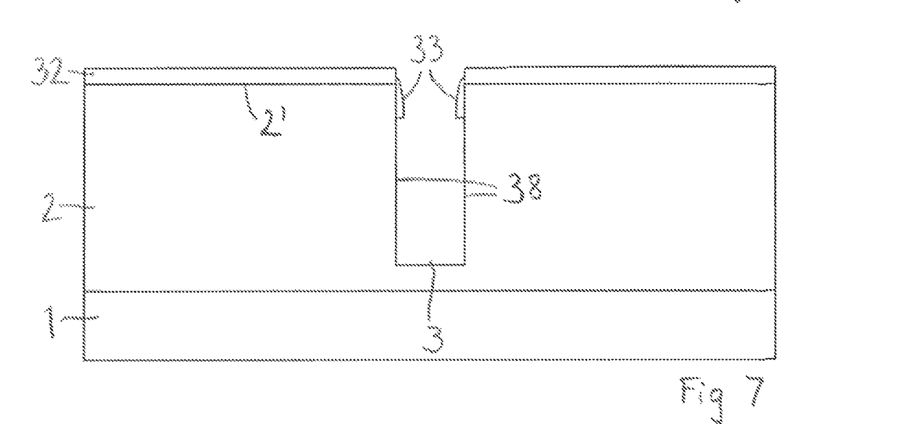
FIG. 7 is a cross section according to FIG. 6 after the formation of the trench.

FIG. 7 is a cross section according to FIG. 6 of an intermediate product that is obtained when the trench 3 is completely etched. In the embodiment shown in FIG. 7 the trench 3 is formed within the epi-layer 2. An upper portion of the sidewall 38 is covered by the collar layer 33.

Figure 8:
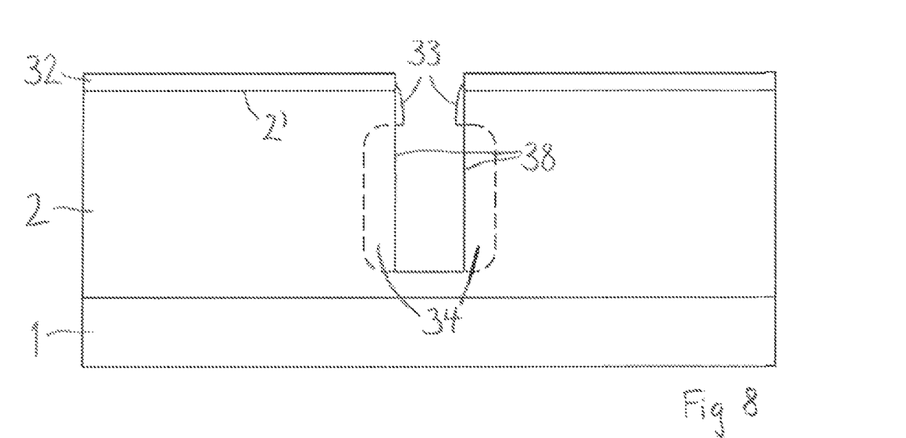
FIG. 8 is a cross section according to FIG. 7 after a sidewall implantation.

FIG. 8 is a cross section according to FIG. 7 of an intermediate product after a dopant has been implanted in the sidewall 38 and possibly also in the bottom of the trench 3. The sidewall implant 34 is shielded by the collar layer 33. The implant dose and energy can be optimized to achieve the desired breakdown voltage at the trench sidewall 38. A thermal annealing of the sidewall implant 34 may be required to diffuse the implanted doping atoms and to shift the pn-junction deeper into the semiconductor material away from the sidewall 38. The sidewall implant 34 is provided as the junction region 14, which is thus formed at a distance from the surface 2', because the doping concentration of the sidewall implant 34 is reduced in the vicinity of the surface 2' owing to the effect of the collar layer 33.

The pn-junction may then be formed by depositing a doped polysilicon layer, especially an in-situ doped polysilicon layer, in particular by means of LPCVD (low-pressure chemical vapor deposition). If the semiconductor body has p-type conductivity, the polysilicon layer is doped for n-type conductivity, and vice versa. LPCVD deposition techniques have been demonstrated to provide very conformal depositions even in high aspect ratio trenches. The semiconductor layer 4 may alternatively be formed by a further implantation in the sidewall 38, the further sidewall implant comprising a dopant for the type of electric conductivity that is opposite to the type of electric conductivity of the first sidewall implant 34.

The collar layer 33 may be removed before the lateral pn-junction of the diode is formed. If the collar layer 33 is not removed before the pn-junction is formed, the collar layer 33 can serve to inhibit the diffusion of the dopant for the second type of electric conductivity from the upper portion of the semiconductor layer 4 into the adjacent semiconductor material and thus to facilitate the reduction of the doping concentration at the pn-junction in the vicinity of the surface 2'.

The breakdown voltage of the structure is determined by the doping levels of the semiconductor layer 4 and the sidewall implant 34. For a breakdown voltage of about 20 V, the doping concentration of the sidewall implant 34 should be at least $10^{17}$ cm$^{-3}$.

Figure 9:
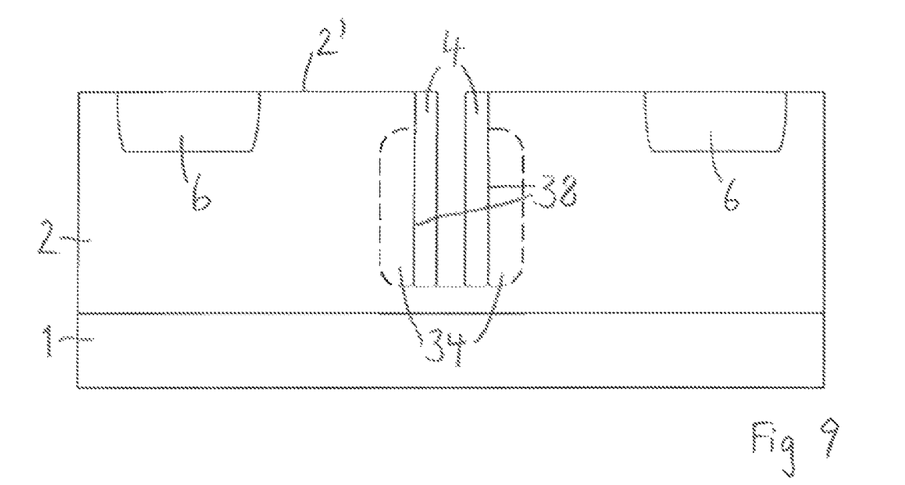
FIG. 9 is a cross section according to FIG. 8 after an application of a semiconductor layer.

FIG. 9 is a cross section according to FIG. 8 of an intermediate product after the formation of the semiconductor layer 4, the removal of the cover layer 32 and the formation of the contact well 6 by an implantation for the first type of electric conductivity. The contact well 6 may instead be formed before the trench 3 is etched. A contact region 5 of the second type of electric conductivity is implanted as a terminal of the semiconductor layer 4.

Figure 10:
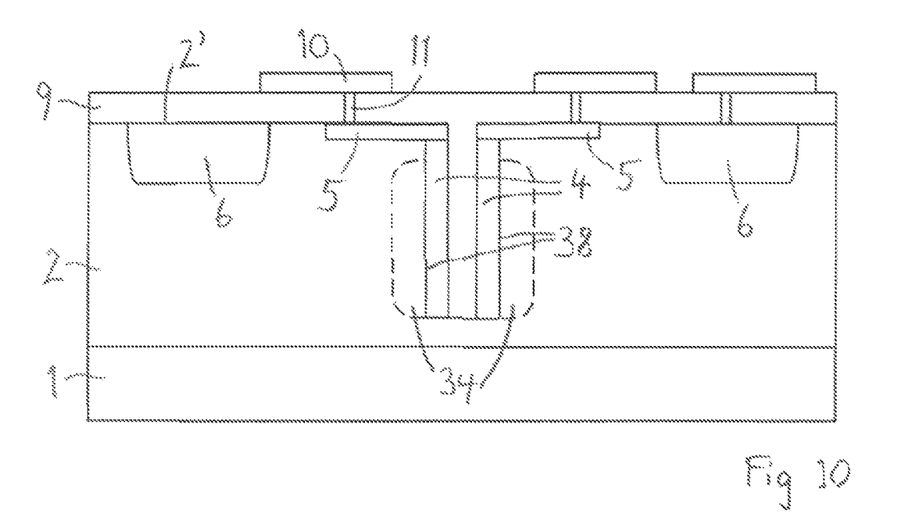
FIG. 10 is a cross section according to FIG. 9 after the formation of anode and cathode terminals.

FIG. 10 is a cross section according to FIG. 8 after the production of a first partial layer of the dielectric 9, a first structured metal layer 10 of the wiring and vertical connections 11 between portions of the metal layer 10 and the contact region 5 and the contact well 6, respectively.

The embodiment according to FIGS. 6 to 10 may be produced by a process flow that comprises the steps of providing a semiconductor substrate 1 with an epi-layer 2, depositing an oxide on the top surface 2' as the cover layer 32 to mask the implants, etching the partial trench 23 to a determined depth, performing an oxidation and an SiN deposition, which may be followed by a deposition of $SiO_2$, etching back the SiN to form the collar layer 33, etching the trench 3 to its final depth, implanting in the sidewall 38, in particular forming the anode, annealing the sidewall implant 34 and smoothing the sidewall 38, implanting the contact well 6, etching the collar layer 33 to remove it, depositing polysilicon in-situ doped or implanting the semiconductor layer 4 or both, filling the trench 3, planarizing the trench filling 8, effecting a diffusion of the dopant of the contact well 6, and performing further conventional process steps as required.

Figure 11:
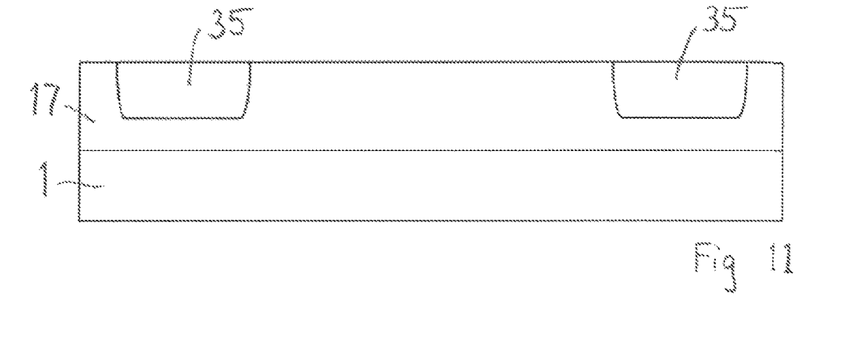
FIG. 11 is a cross section of an intermediate product of a variant of the method.

FIG. 11 is a cross section of a semiconductor body comprising a substrate 1 provided with a first epi-layer 17, which is the starting material of a variant of the method. A doped region 35 of the first type of electric conductivity is formed in the first epi-layer 17.

Figure 12:
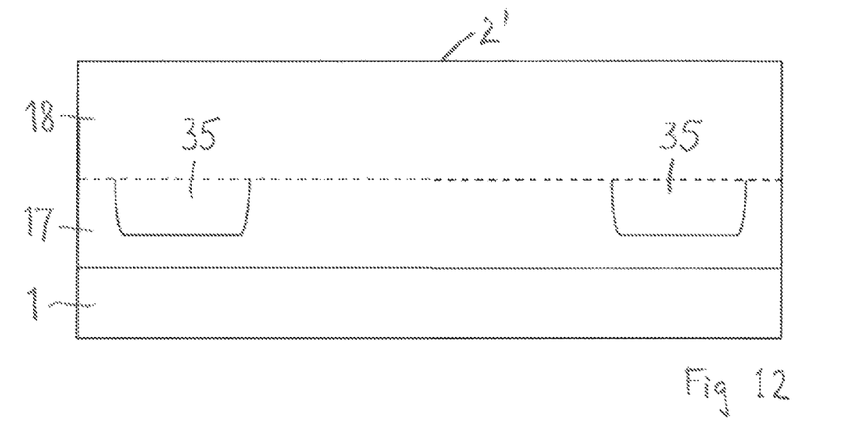
FIG. 12 is a cross section according to FIG. 11 after the formation of an epitaxial layer.

FIG. 12 is a cross section according to FIG. 11 of a further intermediate product, after a second epi-layer 18 has been grown on the first epi-layer 17. The doped region 35 is buried by the second epi-layer 18.

Figure 13:
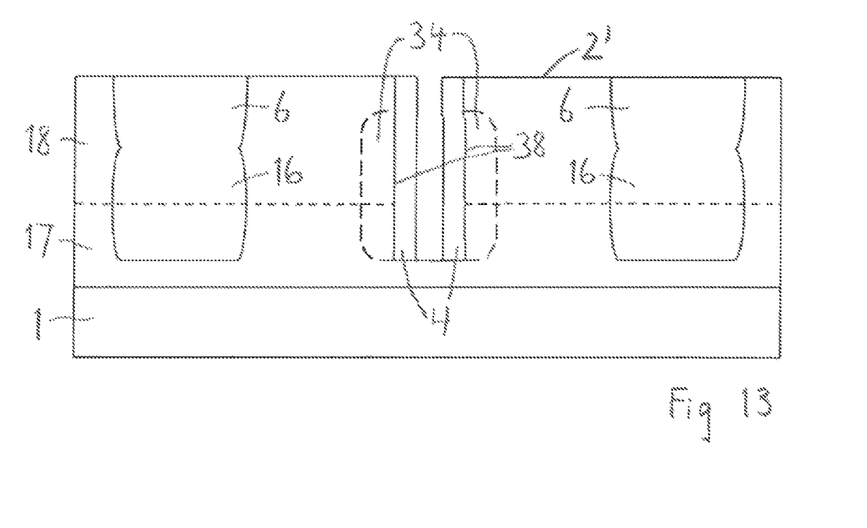
FIG. 13 is a cross section according to FIG. 12 after the formation of a trench and a semiconductor layer.

FIG. 13 is a cross section according to FIG. 12 of a further intermediate product, after the formation the contact well 6, the trench 3, the sidewall implant 34 and the semiconductor layer 4, which may be produced as described above. An annealing step is performed to make the dopant of the doped region 35 diffuse until it reaches the contact well 6, in order to form a continuous doped region of the first type of electric conductivity opposite the sidewall implant 34.

Figure 14:
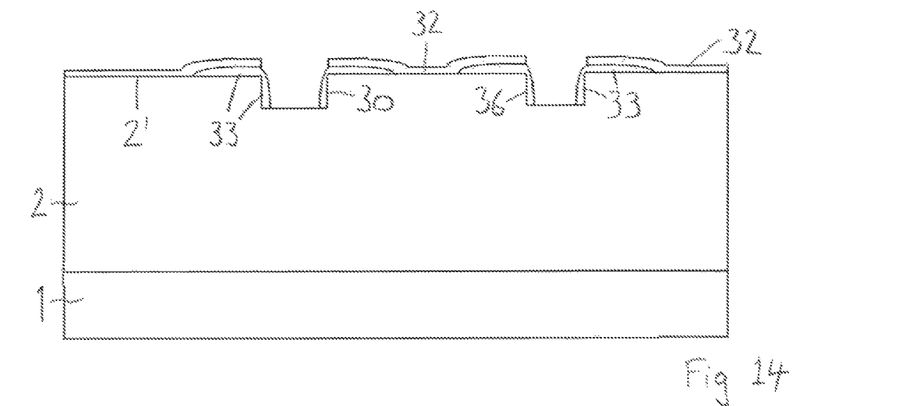
FIG. 14 is a cross section of an intermediate product of a further variant of the method.

FIG. 14 is a cross section of an intermediate product of a further variant of the method. A partial trench 30 and a further partial trench 36 are etched in the epi-layer 2 to a determined depth. A collar layer 33, which may be formed from SiN, is applied to the sidewalls and upper edges of the trenches 3, 23. A cover layer 32, which may be an oxide of the semiconductor material, is applied on top.

Figure 15:
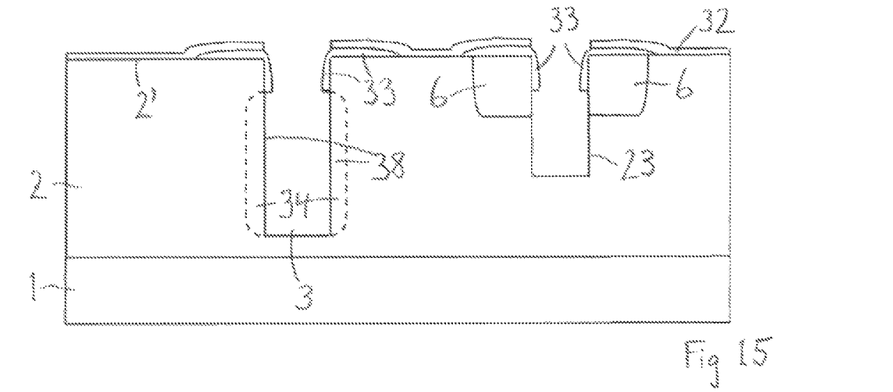
FIG. 15 is a cross section according to FIG. 14 after the formation of a trench and a further trench.

FIG. 15 is a cross section according to FIG. 14 for a further intermediate product, which is obtained after the trench 3 and the further trench 23 have been completely etched and an implantation in the sidewall 38 of the trench 3 has been performed. The sidewall implant 34 is shielded by the collar layer 33 in the upper portion of the trench 3. The trench 3 is optionally etched deeper than the further trench 23. A contact well 6 of the first type of electric conductivity may be formed at the surface 2' adjacent to the further trench 23.

Figure 16:
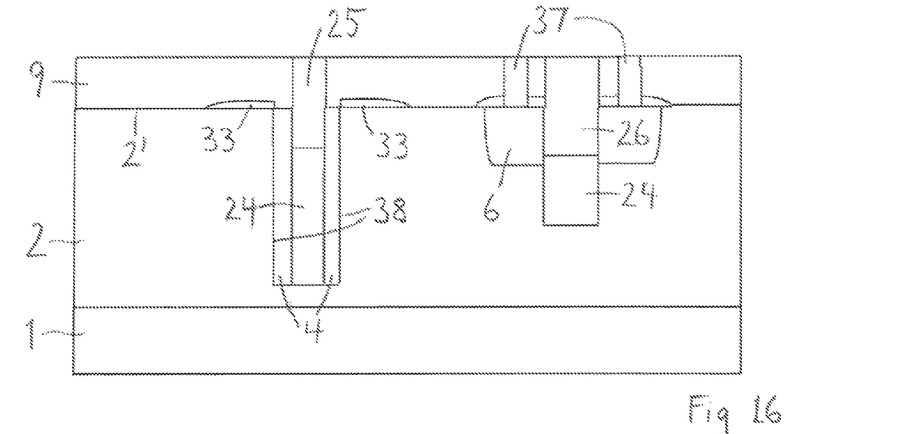
FIG. 16 is a cross section according to FIG. 15 after the formation of anode and cathode terminals.

FIG. 16 is a cross section according to FIG. 15 for a further intermediate product, which is obtained after the semiconductor layer 4 of the second type of electric conductivity has been formed and the trenches 3, 23 have been filled. The lower portions of the trenches 3, 23 may be filled with a dielectric material. Above these partial fillings 24, electrically conductive fillings 25, 26 are provided to form the anode and cathode terminals. The electrically conductive filling 25 in the trench 3 is in contact with the semiconductor layer 4 of the second type of electric conductivity, and the electrically conductive filling 26 in the further trench 23 is in contact with the contact well 6 of the first type of electric conductivity. The electrically conductive fillings 25, 26 may penetrate the dielectric 9 that is arranged above the surface 2', as shown in FIG. 16. A well contact 37 may be applied to the contact well 6.

The embodiment according to FIGS. 14 to 16 may be produced by a process flow that comprises the steps of providing a semiconductor substrate 1 with an epi-layer 2, etching the partial trench 23 and the further partial trench 36 to a determined depth, depositing SiN and $SiO_2$ on the surface 2', etching the SiN back to form the collar layer 33, etching the trench 3 and the further trench 23 to their respective final depths, implanting in the sidewall 38, in particular forming the anode, annealing the sidewall implant 34 and smoothing the sidewall 38, implanting the contact well 6, etching the collar layer 33 to remove it from the sidewall 38, depositing a preliminary filling of the trenches 3, 23 and planarizing the trench filling, effecting a diffusion of the dopant of the contact well 6, performing further process steps relating to the integrated circuit 7, removing the preliminary trench filling, depositing an in-situ doped polysilicon layer by LPCVD in order to form the semiconductor layer 4 of the second type of electric conductivity, etching back the polysilicon until the remaining portion of the collar layer 33 is reached, applying the partial fillings 24, introducing WSi/W in the trenches 3, 23 to form the electrically conductive fillings 25, 26, and performing further conventional process steps as required.

Figure 17:
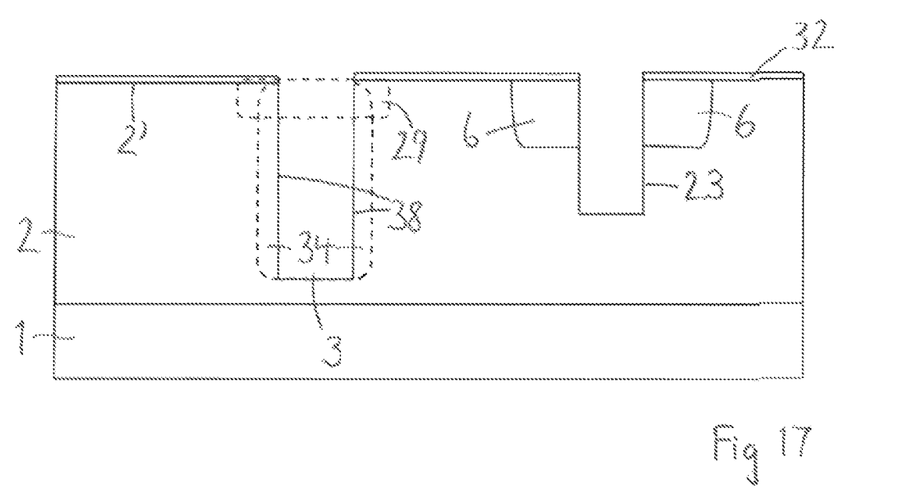
FIG. 17 is a cross section according to FIG. 15 for a further variant of the method.

FIG. 17 is a cross section according to FIG. 15 for a further variant of the method, in which no collar layer is used to shield the sidewall implant 34 in an upper portion of the sidewall 38 of the trench 3. In this variant the sidewall implant 34 is introduced up to the surface 2'. A counterdoping is performed by an implant of a dopant for the first type of electric conductivity to form the counterdoped region 29 shown in FIG. 17. The counterdoped region 29 comprises a reduced electric conductivity to avoid a breakdown in this area. The trench 3 may be filled with doped polysilicon to allow the appertaining terminal, in particular the anode terminal, to be formed according to the avalanche diode shown in FIG. 3. Instead, an electrically conductive filling 25 may be introduced in the trench 3 to produce the embodiment shown in FIG. 5.

The described lateral single-photon avalanche diode has several advantages. The absorption of infrared wavelengths is increased without increasing the breakdown voltage of the diode. By applying the proposed fabrication method, the breakdown voltage region is localized away from the trench edges, ensuring a proper Geiger-mode operation in the central region of the trench. The electric field is constant at the central region of the trench, ensuring that the avalanche is triggered independently of the depth where the electron-hole pair is generated. The breakdown voltage of the structure can be defined by adjusting the doping concentration of the implanted and/or deposited layers.

The invention claimed is:

1. A lateral single-photon avalanche diode, comprising:
a semiconductor body comprising a semiconductor material of a first type of electric conductivity;
a trench having a sidewall arranged in the semiconductor body;
anode and cathode terminals,
wherein the semiconductor material comprises a junction region of the first type of electric conductivity near the sidewall of the trench, and the electric conductivity is higher in the junction region than at a farther distance from the sidewall; and
a semiconductor layer of an opposite second type of electric conductivity arranged at the sidewall of the trench directly adjacent to the junction region,
wherein the anode and cathode terminals are electrically connected with the semiconductor layer and with the junction region, respectively,
wherein a plane upper surface of the semiconductor body is present outside the trench, and a counterdoped region of the first type of electric conductivity separates the junction region and the semiconductor layer of the second type of electric conductivity from the plane upper surface,
wherein the trench intersects the plane upper surface of the semiconductor body,
wherein the semiconductor layer and the junction region form a pn-junction with one another, and
wherein the anode and cathode terminals and the counterdoped region extend to the plane upper surface.

2. The lateral single-photon avalanche diode according to claim 1, wherein the semiconductor layer is a doped polysilicon layer.

3. The lateral single-photon avalanche diode according to claim 1, wherein the semiconductor layer is a doped region of the semiconductor body adjacent to the sidewall of the trench.

4. The lateral single-photon avalanche diode according to claim 1, wherein the junction region is at a distance from the plane upper surface.

5. The lateral single-photon avalanche diode according to claim 1, further comprising:
a contact well of the first type of electric conductivity arranged in the semiconductor body, the contact well providing one of the anode and cathode terminals.

6. The lateral single-photon avalanche diode according to claim 1, further comprising:

a further trench arranged at a distance from the trench, the further trench comprising one of the anode and cathode terminals.

7. The lateral single-photon avalanche diode according to claim 6, wherein the trench is deeper than the further trench.

8. The lateral single-photon avalanche diode according to claim 6, wherein the anode and cathode terminals are formed by electrically conductive fillings in the trench and in the further trench.

* * * * *